US 6,712,213 B2

(12) United States Patent
Eggum

(10) Patent No.: US 6,712,213 B2
(45) Date of Patent: Mar. 30, 2004

(54) WAFER CARRIER DOOR AND LATCHING MECHANISM WITH HOURGLASS SHAPED KEY SLOT

(75) Inventor: Shawn D. Eggum, Lonsdale, MN (US)

(73) Assignee: Entegris, Inc., Chaska, MN (US)

(*) Notice: Subject to any disclaimer, the term of this patent is extended or adjusted under 35 U.S.C. 154(b) by 0 days.

(21) Appl. No.: 10/307,894

(22) Filed: Dec. 2, 2002

(65) Prior Publication Data
US 2003/0132136 A1 Jul. 17, 2003

Related U.S. Application Data
(60) Provisional application No. 60/349,166, filed on Jan. 15, 2002.

(51) Int. Cl.⁷ .............................................. B65D 85/90
(52) U.S. Cl. ..................... 206/711; 206/454; 206/710
(58) Field of Search ............................ 70/63, 336, 346, 70/407; 206/454, 710, 711

(56) References Cited
U.S. PATENT DOCUMENTS

| 4,185,481 | A | * | 1/1980 | Tranberg et al. .......... 70/379 R |
| 4,440,010 | A | * | 4/1984 | Guiraud ...................... 70/409 |
| 5,916,281 | A | * | 6/1999 | Kester et al. ................. 70/224 |
| 5,957,292 | A | * | 9/1999 | Mikkelsen et al. ......... 206/710 |

* cited by examiner

Primary Examiner—Jim Foster
(74) Attorney, Agent, or Firm—Patterson, Thuente, Skaar & Christensen, P.A.

(57) ABSTRACT

A door for a wafer carrier having a latching mechanism with a rotatable actuating member. The rotatable actuating member is actuated from outside the wafer carrier using a key inserted into a key slot in the rotatable actuating member. The key slot is formed in an hourglass shape and comprised of abrasion resistant material to reduce generation of particulate contaminants.

26 Claims, 5 Drawing Sheets

WAFER CARRIER DOOR AND LATCHING MECHANISM WITHHOURGLASS SHAPED KEY SLOT

This application claims the benefit under 35 U.S.C 119(e) of U.S. Provisional Application No. 60/349,166 filed on Jan. 15, 2002.

BACKGROUND OF THE INVENTION

1. Field of the Invention

The present invention generally pertains to a wafer carrier designed for supporting, constraining, storing and precisely positioning semi-conductor wafer disks for use in the production of integrated circuits. More specifically, the present invention pertains to a key slot for actuating a latching mechanism to secure a door on a wafer container enclosure.

2. Discussion of the Related Art

Processing of semi-conductor wafers into finished electronic components typically requires many processing steps where the wafers must be handled and processed. The wafers are very valuable, and are extremely delicate and easily damaged by physical and electrical shocks. In addition, successful processing requires the utmost in cleanliness, free of particulates and other contaminants. As a result, specialized containers or carriers have been developed for use during processing, handling and transport of wafers. These containers protect the wafers from physical and electrical hazards, and are sealable to protect the wafers from contaminants.

Various configurations of door enclosures and latching mechanisms for sealable wafer carriers are known in the art. Known latching mechanisms often use rotatable actuating members. These actuating members may include a cam, but sometimes are geared. The actuating member in such a mechanism is generally rotated robotically from outside the carrier using a key having a substantially rectangular cross-section. The key is inserted through an opening in the outer surface of the door and into a key slot formed in the rotatable actuating member. Previously, key slots have generally been rectangular in cross-section.

Tolerance must be provided between the key and the key slot in order to allow for insertion of the key. When the key is rotated to cause rotation of the cam member, this tolerance allows the key to rotate slightly within the key slot. The corners of the key bear against the sides of the key slot and become the points where the rotational force of the key is transmitted to the key slot and associated cam member. A relatively small area of the key is in contact with the sides of the key slot, and since all of the rotational force is transmitted through this small area, very high stress levels are experienced in the key and the key slot sides at the point of contact. The result is abrasion of the materials and the generation of undesirable particulate contaminants.

To minimize the abrasion problem when using a rectangular key slot, the key to key-slot tolerances must be kept relatively small. Reduced tolerance, however, can cause key insertion difficulty and key jams, resulting in key slot and key damage. Such damage causes undesirable particulates, along with process inefficiencies and production disruption.

What is needed is some sort of key slot for use with a rectangular cross-section key that offers increased bearing surface while also allowing a relatively large key to key-slot tolerance.

SUMMARY OF THE INVENTION

The present invention fulfills the described needs by providing a greater bearing area where the key is in contact with the key slot, and by also allowing for increased tolerance between the two parts. In the invention, the key slot is made in a generally hourglass shape. The hourglass shape allows the flats of the key to bear against the key slot sides rather than the corners of the key, allowing a larger area for force transmission and correspondingly reduced material stress.

The interior surfaces of the key slot may be formed from hard, abrasion resistant material such as polyether imide (PEI) plastic, reducing abrasion of material and particulate generation. The key slot material may be electrically conductive to allow for an electrical path to ground. Since rotation of the key within the key slot need not be as closely restricted, a larger key slot with greater key to key slot tolerances can be used, resulting in relatively easier key insertion, less component damage and less key jamming.

Accordingly, it is an object and advantage of the invention to reduce generation of particulate matter resulting from contact between a key and a key slot in a wafer carrier latch mechanism.

It is a further object and advantage of the invention to reduce key jamming and resultant production inefficiencies.

It is a still further object and advantage of the invention to reduce key and key slot damage resulting from insertion and removal of the key.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
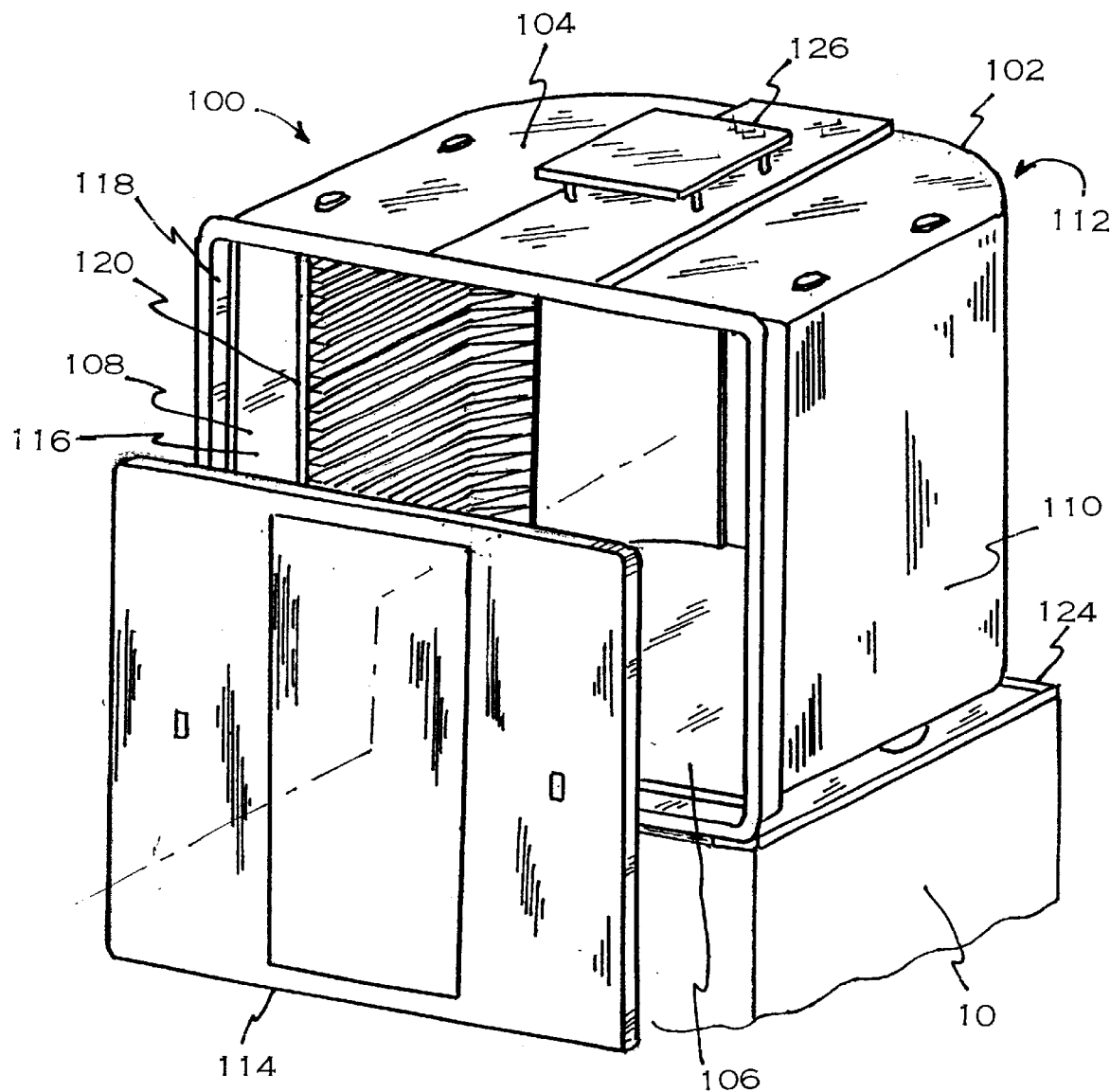
FIG. 1 is a perspective view of a typical semi-conductor wafer transport container.

Referring first to FIG. 1, there is shown generally a wafer container 100. Wafer container 100 has an enclosure portion 102, constructed of polycarbonate plastic, and consisting of a top 104, a bottom 106, a pair of opposing sides 108 and 110, and a back 112. A door 114 completes the enclosure by enclosing the open front 116 of enclosure portion 102, fitting into door recess 118. Wafer supports 120 (not shown) and 122 are provided to support semi-conductor wafers within the enclosure. Kinematic coupling 124, mounted to the exterior surface of enclosure bottom 106 is provided to facilitate automated handling of the container during use and to provide a reference datum for locating the wafers in the housing during processing. Robotic lifting flange 126 is mounted on the exterior surface of enclosure top 104 and is provided to facilitate automated handling and transport of container 100 during use.

Figure 2:
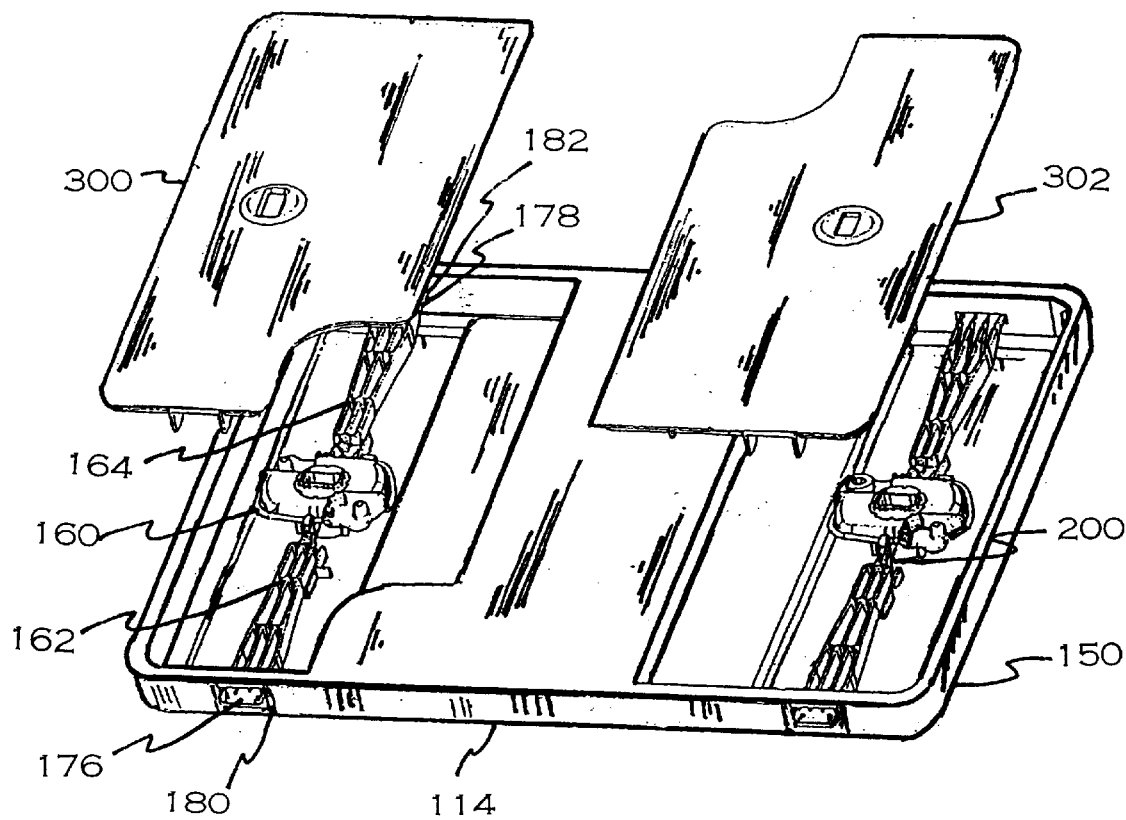
FIG. 2 is a perspective view of the wafer container door showing the latch mechanisms disposed in the door.

Referring to FIG. 2, the wafer carrier door 114 of the present invention is shown. Door 114 is comprised generally of a door chassis 150 and latching mechanisms 160 and 200. Mechanism covers 300 and 302 are provided to protect the latching mechanisms 160 and 200 from physical damage and contamination and to retain and guide the latching mechanism components.

Figure 3:
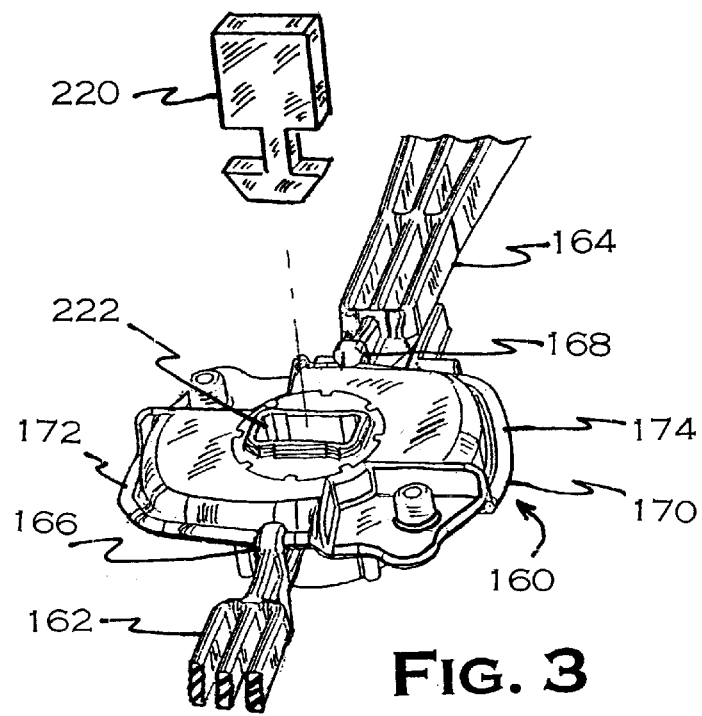
FIG. 3 is a partial perspective view of a latch mechanism showing a key and key slot.

Referring now to FIGS. 2 and 3, the operation of latching mechanisms 160 and 200 can be understood. In FIG. 3, there is shown a partial view of latching mechanism 160. Latching arms 162 and 164 each have a cam follower portion 166 and 168 respectively, engaged with cam member 170 at cam portions 172 and 174. As shown in FIG. 2, each of latching arms 162 and 164 has a latching portion 176 and 178 at the end opposite from cam follower portions 166 and 168. When key 220 is inserted into key-slot 222 and rotated, cam follower portions 166 and 168 slide along cam portions 172 and 174. Due to the shape of cam member 170, latching arms 162 and 164 are translated radially, extending or retracting latching portions 176 and 178 through latch openings 180 and 182. Latching portions 176 and 178 are received by recesses (not shown) in the wafer carrier, allowing the door to be secured in place.

Figure 4:
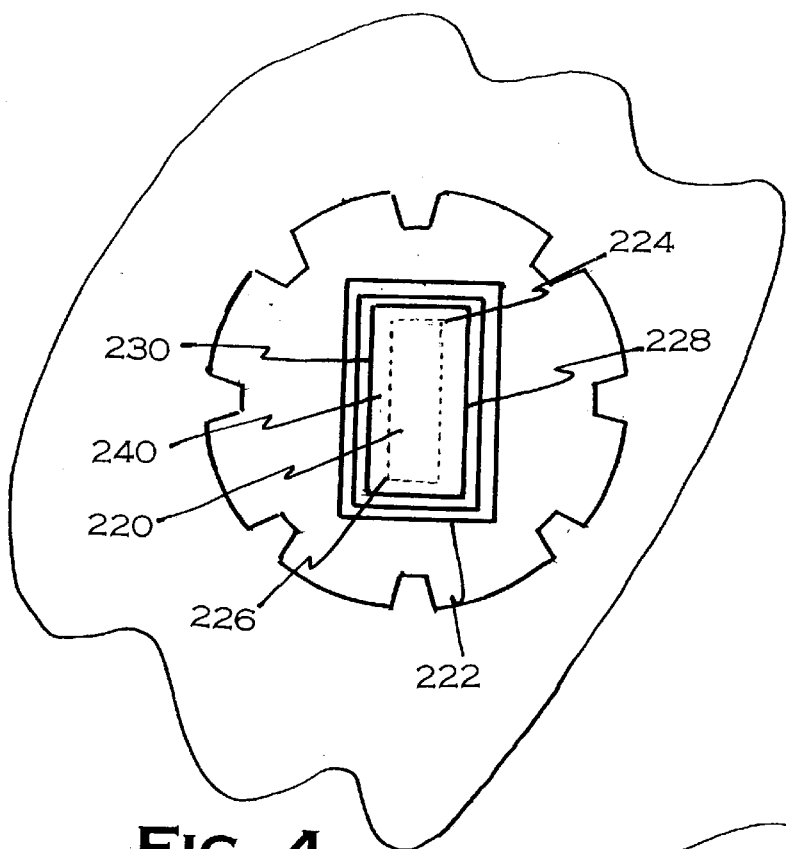
FIG. 4 is a top plan view of a rectangular shaped key slot with a key disposed within.
Figure 5:
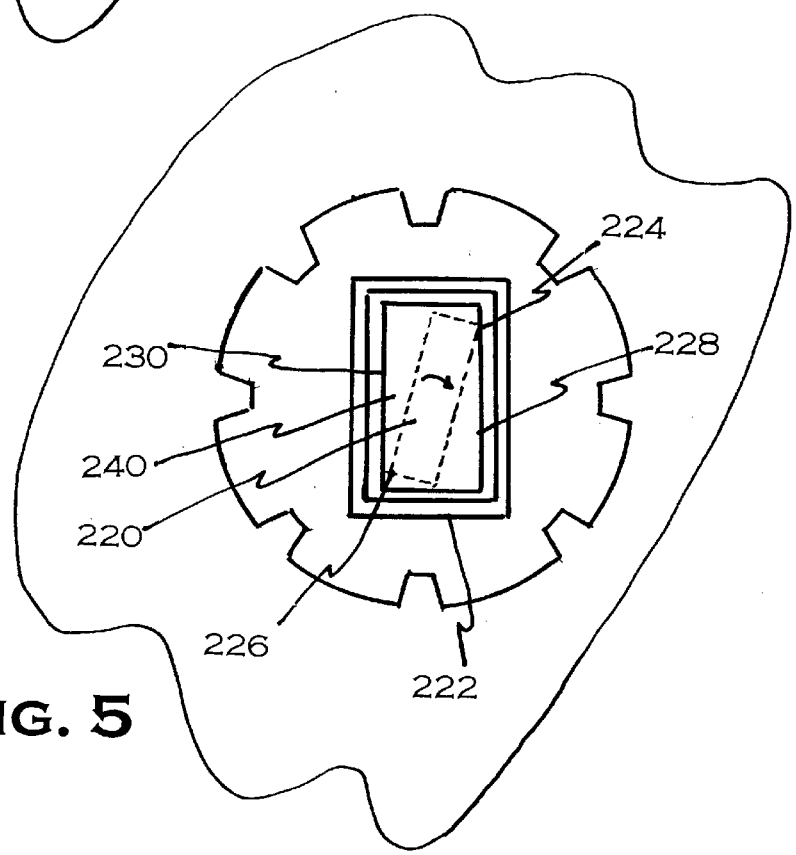
FIG. 5 is a top plan view of a rectangular shaped key slot with a key disposed within after the key has been rotated as in use.

In FIGS. 4 and 5 is shown a top plan view of a rectangular shaped key slot 222 with key 220 inserted. In FIG. 4, key 220 has been inserted in key slot 222, but no rotational force has been applied. Tolerance space 240, shown in exaggerated fashion for clarity, surrounds key 220 and is provided to allow for insertion of key 220. As key 220 is rotated as shown in FIG. 5, tolerance space 240 allows key 220 to rotate slightly in key slot 222, causing key corners 224 and 226 to contact, and bear against, key slot sides 228 and 230. Key corners 224 and 226 constitute a relatively small area, and the entire rotational force transmitted by key 220 bears through them. In consequence, the stress levels in the key at key corners 224 and 226, and in key slot sides 228 and 230 at the points of contact are relatively high. The stress at key corners 224 and 226 is often high enough to cause slight deformation of the corners resulting in sliding and friction with key slot sides 228 and 230. The result is abrasion of material from key corners 224 and 226 and key slot walls 228 and 230, generating undesirable particulates that may contaminate wafer processing operations.

Figure 6:
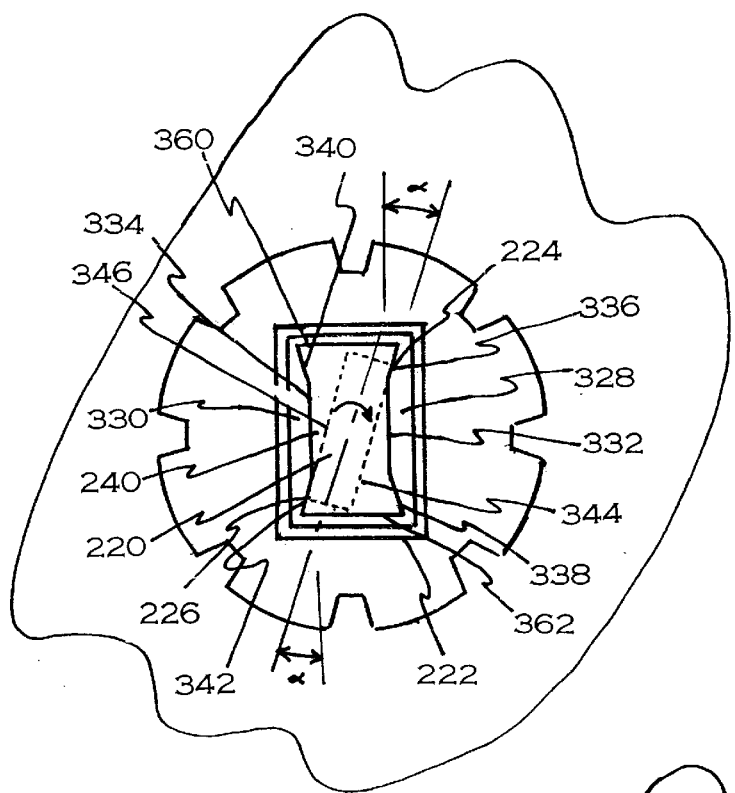
FIG. 6 is a top plan view of a currently most preferred embodiment of the hourglass shaped key slot of the present invention.

A most preferred embodiment of the present invention is shown in FIG. 6. As shown, key slot 222 has an hourglass shape. Key slot sides 328 and 330 have a center portion 332 and 334 that is generally perpendicular to key slot ends 360 and 362. Outwardly angled portions 336 and 338 of key slot side 328, and angled portions 340 and 342 of key slot side 330, form angle α with center portions 332 and 334. Thus, center portion 332 is disposed between outwardly angled portions 336 and 338 and center portion 334 is disposed between outwardly angled portions 340 and 342. A narrowed portion of key slot 222 is thus formed between center portions 332 and 334. Those of skill in the art will recognize that angle α may be selected, based on the relative dimensions of key 220, key slot 222 and tolerance space 240, so that when key 220 rotates clockwise to angle α within key slot 222 as shown, flat sides 344 and 346 of key 220 bear against angled portions 336 and 342. The relatively large area of key 220 in contact with angled portions 336 and 342, and the consequently larger force bearing area, allows for much lower stress levels at the areas of contact. Sliding contact at key corners 224 and 226 is eliminated. The result is less damage to key 220 and key slot 222 and overall decreased generation of particulate contaminants. Those of skill in the art will also recognize that tolerance space 240 can be made relatively larger, since it is not necessary to as closely limit the rotation of key 220 within key-slot 222. This increased tolerance acts to reduce key-jamming and component damage during key insertion.

Particulate generation can be further reduced by lining key slot 222 with hard, abrasion resistant material. It is currently preferred that the material used have a Rockwell hardness of at least M105. The currently preferred material for this purpose is polyether imide (PEI). Other preferred materials are PEEK or PPS. If such plastic material is used, carbon fiber or other electrically conductive fill may be used to form an electrically conductive key-slot that may be used as a portion of an electrical path to ground. Persons of skill in the art will appreciate that any physically suitable abrasion resistant material may be used as a key slot liner, including metallic material.

Figure 7:
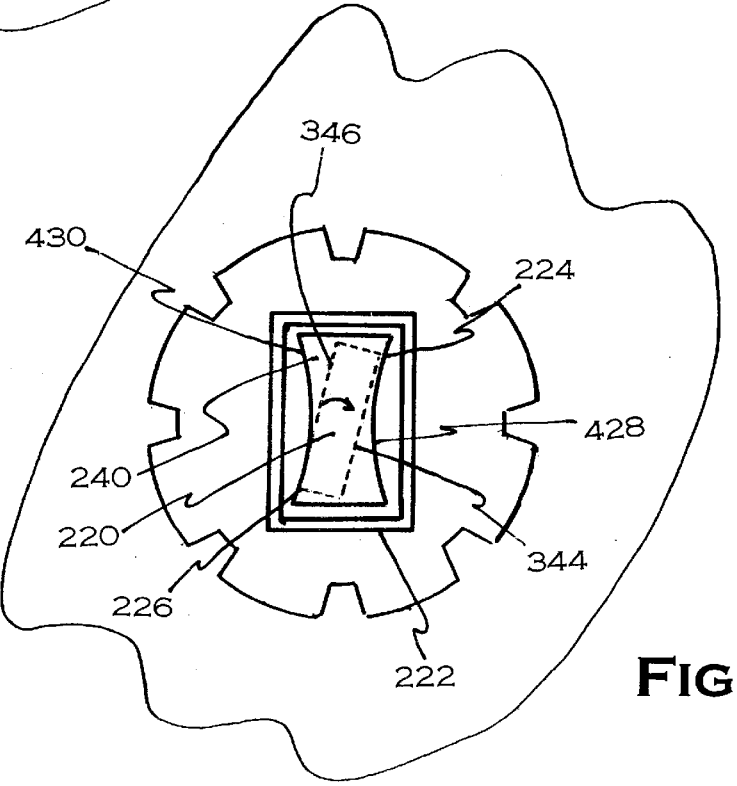
FIG. 7 is a top plan view of another embodiment of the hourglass shaped key slot of the present invention.

An alternative embodiment of the invention shown in FIG. 7. In this embodiment, key slot sides 428 and 430 have an inwardly directed convex shape. As shown, the convex shape allows flat sides 344 and 346 of key 220 to bear against key slot sides 428 and 430.

Figure 8:
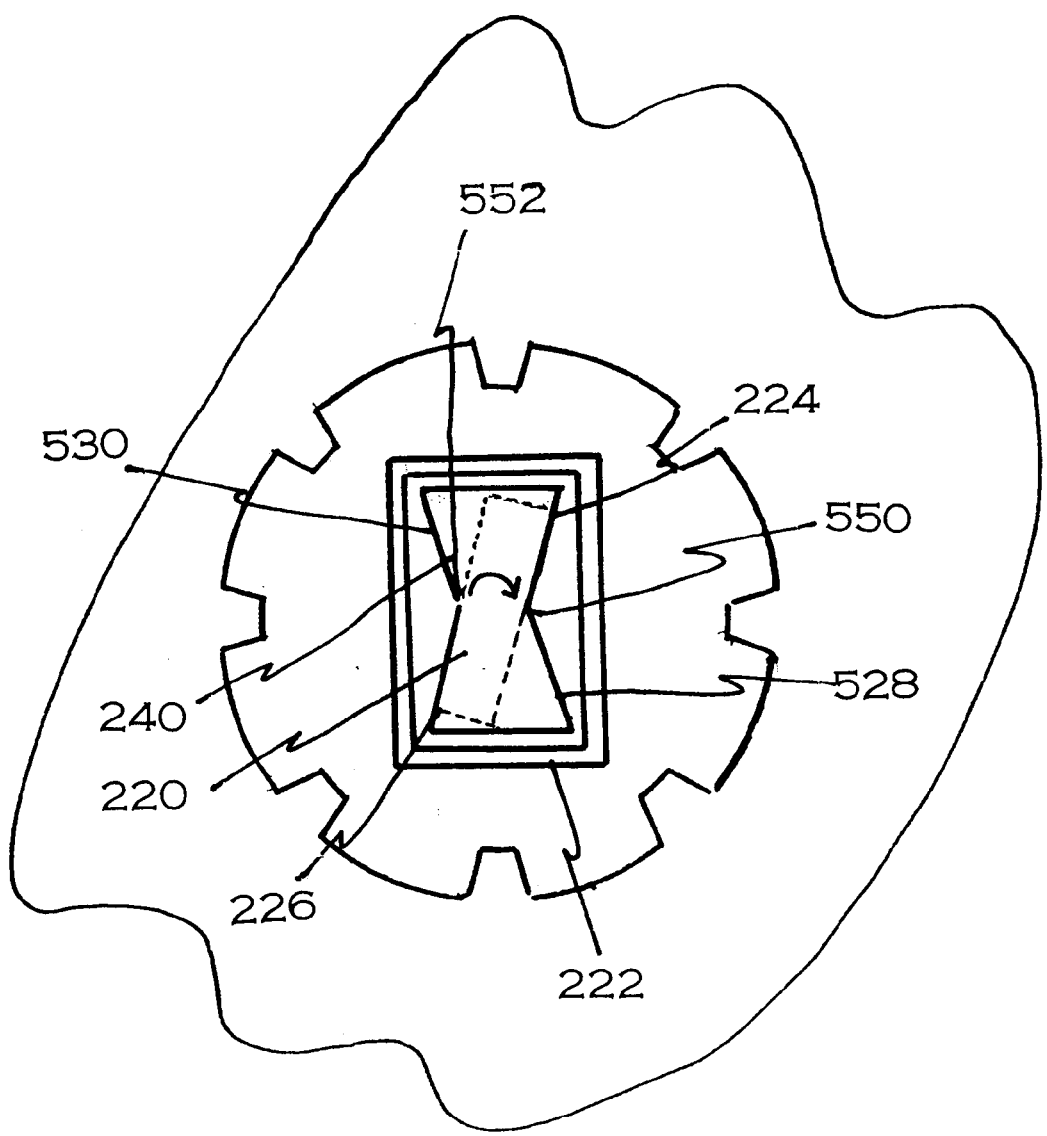
FIG. 8 is a top plan view of a further alternative embodiment of the hourglass shaped key slot of the present invention.

Yet another alternative embodiment of the invention is shown in FIG. 8. Key slot sides 528 and 530 are made with an inwardly directed anticlinal shape. Opposing apexes 550 and 552 may be rounded to minimize possible abrasion at those points during insertion of key 220. Persons of skill in the art will appreciate that many other alternative shapes for key slot 222 having a general hourglass contour and causing contact of the flat sides of the key with the key slot sides are also possible and are within the scope of the invention.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

What is claimed is:

1. A wafer container comprising:
   an enclosure portion having at least a top, a bottom, a pair of opposing sides, a back, an open front, and a door to close the open front, said door comprising:
   a door chassis; and
   at least a first latching mechanism, said latching mechanism comprising:
      at least a first latching arm; and
      a rotatable actuating member coupled to said latching arm, said rotatable actuating member having a substantially hourglass shaped key slot adapted to receive a key so that said rotatable actuating member is rotatable by imparting a rotary motion to said key when said key is received in said key slot.

2. The container of claim 1, wherein said substantially hourglass shaped key slot has a pair of opposing sides and a pair of opposing ends, each of said opposing pair of sides has a center portion disposed between two outwardly angled portions, and said center portion is oriented substantially perpendicular to said opposing ends.

3. The container of claim 1, wherein said substantially hourglass shaped key slot has a pair of opposing sides, each of said pair of opposing sides having an inwardly directed convex shape.

4. The container of claim 1, wherein said substantially hourglass shaped key slot has a pair of opposing sides, each of said pair of opposing sides having an inwardly directed anticlinal shape.

5. The container of claim 1, wherein said key slot is formed from abrasion resistant material.

6. The container of claim 1, wherein said key slot is formed from electrically conductive material.

7. A wafer container comprising:
an enclosure portion having at least a top, a bottom, a pair of opposing sides, a back, an open front, and a door to close the open front, said door comprising:
a door chassis; and
at least a first latching mechanism, said latching mechanism comprising:
at least a first latching arm; and
a rotatable actuating member coupled to said latching arm, said rotatable actuating member having a substantially hourglass shaped key slot, adapted to receive a key so that said rotatable actuating member is rotatable by imparting a rotary motion to said key when said key is received in said key slot, said substantially hourglass shaped key slot having a pair of opposing sides and a pair of opposing ends, each of said opposing pair of sides has a center portion disposed between two outwardly angled portions, and said center portion oriented substantially perpendicular to said opposing ends.

8. The container of claim 7, wherein said key slot is formed from abrasion resistant material.

9. The container of claim 7, wherein said key slot is formed from electrically conductive material.

10. A wafer container comprising:
an enclosure portion having at least a top, a bottom, a pair of opposing sides, a back, an open front, and a door to close the open front, said door comprising:
a door chassis; and
at least a first latching mechanism, said latching mechanism comprising:
at least a first latching arm; and
a rotatable actuating member coupled to said latching arm, said rotatable actuating member having a substantially hourglass shaped key slot adapted to receive a key so that said rotatable actuating member is rotatable by imparting a rotary motion to said key when said key is received in said key slot, said substantially hourglass shaped key slot having a pair of opposing sides, each of said pair of opposing sides having an inwardly directed convex shape.

11. The container of claim 10, wherein said key slot is formed from abrasion resistant material.

12. The container of claim 10, wherein said key slot is formed from electrically conductive material.

13. A wafer container comprising:
an enclosure portion having at least a top, a bottom, a pair of opposing sides, a back, an open front, and a door to close the open front, said door comprising:
a door chassis; and
at least a first latching mechanism, said latching mechanism comprising:
at least a first latching arm; and
a rotatable actuating member coupled to said latching arm, said rotatable actuating member having a substantially hourglass shaped key slot adapted to receive a key so that said rotatable actuating member is rotatable by imparting a rotary motion to said key when said key is received in said key slot, said substantially hourglass shaped key slot having a pair of opposing sides, each of said pair of opposing sides having an inwardly directed anticlinal shape.

14. The container of claim 13, wherein said key slot is formed from abrasion resistant material.

15. The container of claim 13, wherein said key slot is formed from electrically conductive material.

16. A wafer transport container comprising:
an enclosure portion having at least a top, a bottom, a pair of opposing sides, a back, an open front, and a door to close the open front, said door comprising:
a door chassis; and
at least a first latching mechanism, the latching mechanism comprising:
at least a first latching arm; and
a rotatable cam member coupled with the latching arm, the cam member having a key slot adapted to receive a key so that said rotatable cam member is rotatable by imparting a rotary motion to said key when said key is received in said key slot, the key slot having a pair of opposing ends, said key slot further having a narrowed portion intermediate of the ends.

17. The container of claim 16, wherein said key slot is substantially hourglass shaped.

18. The container of claim 17, wherein said substantially hourglass shaped key slot has a pair of opposing sides and a pair of opposing ends, each of said opposing pair of sides has a center portion disposed between two outwardly angled portions, and said center portion is oriented substantially perpendicular to said opposing ends.

19. The container of claim 17, wherein said substantially hourglass shaped key slot has a pair of opposing sides, each of said pair of opposing sides having an inwardly directed anticlinal shape.

20. The container of claim 17, wherein said key slot is formed from abrasion resistant material.

21. The container of claim 17, wherein said key slot is formed from electrically conductive material.

22. A wafer container comprising:
an enclosure portion having at least a top, a bottom, a pair of opposing sides, a back, an open front, and a door to close the open front, said door comprising:
a door chassis; and
at least a first latching mechanism, said latching mechanism comprising:
at least a first latching arm;
a rotatable actuating member coupled to said latching arm, said rotatable actuating member having a key slot adapted to receive a key so that said rotatable actuating member is rotatable by imparting a rotary motion to said key when said key is received in said key slot; and
means for reducing generation of particulates resulting from the insertion, rotation and removal of a key from said key slot.

23. The container of claim 22, wherein said means for reducing generation of particulates resulting from the insertion, rotation and removal of a key from said key slot comprises said key slot having substantially an hourglass shape.

24. The container of claim 23, wherein said substantially hourglass shaped key slot has a pair of opposing sides and a pair of opposing ends, each of said opposing pair of sides has a center portion disposed between two outwardly angled portions, and said center portion oriented substantially perpendicular to said opposing ends.

25. The container of claim 23, wherein said substantially hourglass shaped key slot has a pair of opposing sides, each of said pair of opposing sides having an inwardly directed convex shape.

26. The container of claim 23, wherein said substantially hourglass shaped key slot has a pair of opposing sides, each of said pair of opposing sides having an inwardly directed anticlinal shape.

* * * * *